(12) United States Patent
Joshi et al.

(10) Patent No.: US 7,786,021 B2
(45) Date of Patent: Aug. 31, 2010

(54) HIGH-DENSITY PLASMA MULTILAYER GATE OXIDE

(75) Inventors: Pooran Chandra Joshi, Vancouver, WA (US); Apostolos T. Voutsas, Portland, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 345 days.

(21) Appl. No.: 11/264,979

(22) Filed: Nov. 2, 2005

(65) Prior Publication Data

US 2006/0060859 A1 Mar. 23, 2006

Related U.S. Application Data

(63) Continuation-in-part of application No. 10/295,400, filed on Nov. 14, 2002, now Pat. No. 6,902,960, and a continuation-in-part of application No. 10/801,374, filed on Mar. 15, 2004, now Pat. No. 7,087,537, and a continuation-in-part of application No. 10/801,377, filed on Mar. 15, 2004, now Pat. No. 7,122,487, and a continuation-in-part of application No. 10/812,591, filed on Mar. 29, 2004, now Pat. No. 7,122,488, and a continuation-in-part of application No. 10/831,424, filed on Apr. 23, 2004, now Pat. No. 6,995,053, and a continuation-in-part of application No. 10/871,939, filed on Jun. 17, 2004, now Pat. No. 7,186,663, and a continuation-in-part of application No. 11/139,726, filed on May 26, 2005, now Pat. No. 7,381,595.

(51) Int. Cl.
*H01L 21/31* (2006.01)
*H01L 21/469* (2006.01)

(52) U.S. Cl. .................... 438/771; 438/156; 438/788; 257/E21.412; 257/E29.128

(58) Field of Classification Search ................. 438/788, 438/156, 771; 257/E29.128, E21.412
See application file for complete search history.

(56) References Cited

U.S. PATENT DOCUMENTS 5,098,865 A * 3/1992 Machado et al. ............ 438/788
5,212,118 A * 5/1993 Saxena ....................... 427/582

(Continued)

OTHER PUBLICATIONS

Quirk, M. and Serda, J.; 2001; "Semiconductor Manufacturing Technology"; Prentice-Hall, Inc.; pp. 277-282.*

*Primary Examiner*—Matthew C Landau
*Assistant Examiner*—Vicki B Booker
(74) *Attorney, Agent, or Firm*—Law Office of Gerald Maliszewski; Gerald Maliszewski

(57) ABSTRACT

A thin-film transistor (TFT) with a multilayer gate insulator is provided, along with a method for forming the same. The method comprises: forming a channel, first source/drain (S/D) region, and a second S/D region in a Silicon (Si) active layer; using a high-density plasma (HDP) source, growing a first layer of Silicon oxide (SiOx) from the Si active layer, to a first thickness, where x is less than, or equal to 2; depositing a second layer of SiOx having a second thickness, greater than the first thickness, overlying the first layer of SiOx; using the HDP source, additionally oxidizing the second layer of SiOx, wherein the first and second SiOx layers form a gate insulator; and, forming a gate electrode adjacent the gate insulator. In one aspect, the second Si oxide layer is deposited using a plasma-enhanced chemical vapor deposition (PECVD) process with tetraethylorthosilicate (TEOS) precursors.

19 Claims, 6 Drawing Sheets

U.S. PATENT DOCUMENTS

| | | | |
|---|---|---|---|
| 5,660,895 A * | 8/1997 | Lee et al. | 427/579 |
| 5,865,896 A * | 2/1999 | Nowak et al. | 118/723 I |
| 5,976,993 A * | 11/1999 | Ravi et al. | 438/788 |
| 6,124,154 A * | 9/2000 | Miyasaka | 438/151 |
| 6,184,158 B1 * | 2/2001 | Shufflebotham et al. | 438/788 |
| 6,534,421 B2 * | 3/2003 | Kakkad | 438/771 |
| 7,273,638 B2 * | 9/2007 | Belyansky et al. | 427/539 |
| 2002/0168804 A1 * | 11/2002 | Van der Zaag et al. | 438/149 |
| 2003/0022526 A1 * | 1/2003 | Vyvoda et al. | 438/788 |

* cited by examiner

HIGH-DENSITY PLASMA MULTILAYER GATE OXIDE

RELATED APPLICATIONS

This application is a continuation-in-part of an issued patent application entitled, OXIDE INTERFACE AND A METHOD FOR FABRICATING OXIDE THIN FILMS, invented by Joshi et al., Ser. No. 10/295,400, filed Nov. 14, 2002, now U.S. Pat. No. 6,902,960.

This application is a continuation-in-part of an issued patent application entitled, METHODS FOR FABRICATING OXIDE THIN-FILMS, invented by Joshi et al., Ser. No. 10/801,374, filed Mar. 15, 2004, now U.S. Pat. No. 7,087,537.

This application is a continuation-in-part of an issued patent application entitled, METHODS FOR FORMING AN OXIDE WITH IMPROVED OXYGEN BONDING, invented by Pooran Joshi, Ser. No. 10/801,377, filed Mar. 15, 2004, now U.S. Pat. No. 7,122,487.

This application is a continuation-in-part of a pending patent application entitled, HIGH DENSITY PLASMA PROCESS FOR THE FORMATION OF SILICON DIOXIDE ON SILICON CARBIDE SUBSTRATES, invented by Joshi et al., Ser. No. 10/812,591, filed Mar. 29, 2004, now U.S. Pat. No. 7,122,488.

This application is a continuation-in-part of an issued patent application entitled, VERTICAL THIN-FILM TRANSISTOR, invented by Schuele et al., Ser. No. 10/831,424, filed Apr. 23, 2004, now U.S. Pat. No. 6,995,053.

This application is a continuation-in-part of an issued patent application entitled, HIGH-DENSITY PLASMA PROCESS FOR SILICON THIN-FILMS, invented by Pooran Joshi, Ser. No. 10/871,939, filed Jun. 17, 2004, now U.S. Pat. No. 7,186,663.

This application is a continuation-in-part of an issued patent application entitled, HIGH-DENSITY PLASMA OXIDATION FOR ENHANCED GATE OXIDE PERFORMANCE, invented by Joshi et al., Ser. No. 11/139,726, filed May 26, 2005, now U.S. Pat. No. 7,381,595.

The above-mentioned applications are incorporated herein by reference.

BACKGROUND OF THE INVENTION

1. Field of the Invention

This invention generally relates to the fabrication of integrated circuit (IC) devices, and more particularly, to a multilayer gate oxide and a method for forming the same using high-density plasma oxidation.

2. Description of the Related Art

The quality of polysilicon thin-films and the interface between silicon and silicon dioxide ($SiO_2$) layers are critical to the performance of thin-film transistors, MOS capacitors, and various ICs. The quality of the $SiO_2$ interface is dependent upon the quality of the $SiO_x$ (where x is less than, or equal to 2) transition layer at the interface and the defects in the poly-Si layer. The general approach is to improve the quality of the $SiO_x$ transition layer at the $SiO_2$ interface. Defects in the poly-Si can also be passivated and the stoichiometry improved by oxidation and hydrogenation processes.

Although lower temperatures are generally desirable for any device fabrication process, they are especially critical in LCD manufacture, where large-scale devices are formed on a transparent glass, quartz, or plastic substrate. These transparent substrates can be damaged when exposed to temperatures exceeding 650 degrees C. To address this temperature issue, low-temperature Si oxidation processes have been developed. These processes use a high-density plasma source such as an inductively coupled plasma (ICP) source, and are able to form Si oxide with a quality comparable to 1200 degree C. thermal oxidation methods.

Various semiconductor devices require the deposition of $SiO_2$, or other oxide thin-films, on structures that are both planar and non-planar. For planar surfaces there is usually no problem in depositing uniform $SiO_2$ thin-films over large areas in the fabrication of stable and reliable devices. However, for a device with vertical steps in the structure, such as shallow-trench isolation (STI), vertical thin-film transistors (V-TFTs), graded steps, or curved surfaces, it is important to deposit $SiO_2$ films with sufficient step-coverage to maintain film integrity, device performance, and yield. Thermal oxide has proven to be the most suitable oxide from the step-coverage point of view. However, the low growth rates and high processing temperatures exceeding 800° C. make thermal oxidation unsuitable for low-temperature devices.

Plasma-enhanced chemical vapor deposition (PECVD) processes are suitable for the low temperature processing of the $SiO_2$ thin-films. The electrical quality and the step-coverage of the PECVD deposited oxide thin-film are strongly dependent upon the processing conditions. It is possible to improve the step-coverage of the deposited oxide by decreasing the process temperature or varying the process chemistries and plasma process variables. However, any such attempt to improve the step-coverage results in a corresponding decrease in the oxide quality.

Low-temperature Si oxide deposition processes are also used to fabricate stepped structures, such as an interlevel interconnect via. Although step-coverage is improved by lowering the process temperatures, the quality of the resultant Si oxide is poor. Thus, good Si oxide step-coverage can conventionally be obtained in non-critical areas of an IC structure, such as a field oxide region for example. However, vertical thin-film transistors (V-TFTs) for example, requiring both a high quality Si gate oxide film and good step-coverage, have been difficult to fabricate.

Generally, a fixed oxide charge is a positive charge that remains, after annealing out interface trap charges, and is caused as a result of a structural defect. These fixed oxide charges occur primarily within 2 nanometers of a SiO2 interface. The charge density is dependent upon oxidation and hydrogenation processes. It is known that these fixed oxide charges can be minimized through the use of high oxidation temperatures. Fixed oxide charges in a gate oxide layer can act to degrade the threshold voltage of a transistor.

Oxide trapped charges can be formed at the interface between a silicon layer and a metal or Si substrate, or can be introduced throughout the oxide layer as a result of ion implantation. Mobile ionic charges can also be formed at the silicon oxide interface as a result of ionized alkali metals, sodium, or potassium. A gate insulator with any of the above-mentioned oxide charge types can degrade the threshold voltage, breakdown voltage, and current gain of a transistor.

It would be advantageous if a process could be developed to enhance $Si/SiO_2$ interfaces at a significantly lower thermal budget and temperature.

It would be advantageous if a low-temperature process could be developed that permitted the fabrication of step-covered Si oxide gate insulators.

It would be advantageous if the above-mentioned low-temperature process could reduce the oxide charge concentration in a gate insulator.

SUMMARY OF THE INVENTION

The present invention describes a high-density plasma oxidation process to improve the bulk and interfacial quality of Si oxide thin-films deposited on planar, stepped, graded, or curved surfaces. High-density plasma generated oxide radicals promote the efficient oxidation of the oxide thin-films at significantly lower thermal budgets than the thermal or conventional plasma oxidation processes. In this manner, good oxide step-coverage is achieved simultaneously with good oxide quality and reliability.

More specifically, the present invention describes a low temperature (<400° C.) high-density plasma oxidation process to improve the oxidation state of oxide thin-films. The oxidation state, and oxygen vacancies or defects are the major source of poor electrical performance of oxide or sub-oxide thin-films. The conventional approach to improve the oxidation state of oxide thin-films is to expose them to an oxygen atmosphere at elevated temperatures. However as mentioned above, the thermal oxidation process is not suitable for low temperature devices due to high temperatures and large thermal budgets. Likewise, conventional PECVD processes can be used to improve the oxidation state of deposited oxides. However, the conventional capacitively coupled plasma-based processes have high thermal budgets due to low plasma concentration and energy. Structural damage can occur as a result of attempting to enhance the reaction kinetics by increasing the plasma power, which results in a corresponding increase in the sheath potential.

The present invention plasma oxidation process further addresses the issue of step-coverage for V-TFT devices, which require high step-coverage oxide processes to obtain uniform deposition on the top and side faces, which are perpendicular to each other. The step-coverage of conventional PECVD processes depends on the nature of precursor, process temperatures, and the plasma processing conditions. In general, any conventional attempt to improve the step-coverage results in a degradation of the electrical performance. The present invention post-deposition high-density plasma oxidation process enhances the bulk and interfacial quality of the oxide thin-film, even though the film has been deposited at low temperatures to achieve high step-coverage on graded or abrupt transition surfaces.

Accordingly, a method is provided for forming a gate insulator in a thin-film transistor (TFT). The method comprises: forming a channel, first source/drain (S/D) region, and a second S/D region in a Silicon (Si) active layer; using a high-density plasma (HDP) source, growing a first layer of Silicon oxide (SiOx) from the Si active layer, to a first thickness, where x is less than, or equal to 2; depositing a second layer of SiOx having a second thickness, greater than the first thickness, overlying the first layer of SiOx; using the HDP source, additionally oxidizing the second layer of SiOx, wherein the first and second $SiO_x$ layers form a gate insulator; and, forming a gate electrode adjacent the gate insulator.

In one aspect, the second Si oxide layer is deposited using a plasma-enhanced chemical vapor deposition (PECVD) process with tetraethylorthosilicate (TEOS) precursors. Advantageously, the second layer of SiOx can be additionally oxidized using the HDP source at a temperature of less than 400° C. One advantage to additionally oxidizing the second layer of SiOx, is that the concentration of oxide charges in the second SiOx layer can be decreased. Likewise, the first layer of SiOx can be grown using the HDP source at a temperature of less than 400° C.

In some aspects a vertical channel TFT, or dual-gate TFT are formed. Then, the first and second layers of SiOx (the gate insulator) are formed overlying the gate electrode. The first source/drain region overlies the gate electrode top surface and the channel region overlies the gate insulator on the first gate sidewall. Therefore, the gate insulator has a step, non-planar shape. Advantageously, the gate insulator has a step-coverage of greater than 65%, when comparing the gate top surface to the first gate sidewall.

Additional details of the above-described method, a method for forming multilayer Si oxide thin-films on substrates with abrupt transitions, and V-TFT devices with multilayer gate insulators are presented below.

DETAILED DESCRIPTION

Figure 1:
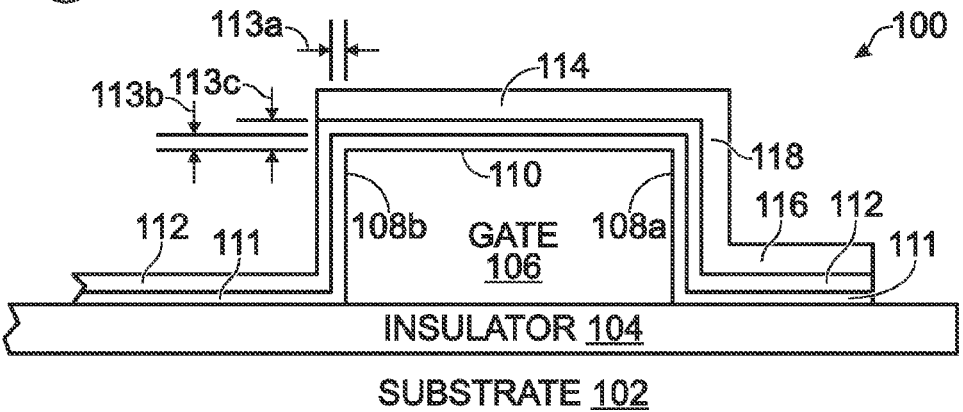
FIG. 1 is a partial cross-sectional view of a vertical thin-film transistor (V-TFT) device.

FIG. 1 is a partial cross-sectional view of a vertical thin-film transistor (V-TFT) device. The V-TFT 100 comprises a substrate 102 and a substrate insulation layer 104 overlying the substrate 102. Generally, the substrate 102 can be a material such as glass, Si, Si<100>, Si<111>, quartz, plastic, or temperature-sensitive material. A gate 106, having vertical sidewalls 108 and a top surface 110, overlies the substrate insulation layer 104. A first Silicon oxide (SiOx) layer 111 overlies the gate top surface 110 and sidewalls 108 having a step-coverage of greater than 65%, where x is less than, or equal to 2. Likewise, a second $SiO_x$ layer 112 overlies the first SiOx layer 111, and has a step-coverage of greater than 65%. Together, the first Si oxide layer 111 and the second Si oxide layer 112 can be considered as the gate insulator or a gate insulator stack.

Using the first Si oxide layer 111 as an example, step-coverage is defined as the ratio of a vertical aspect thickness 113a, to a planar (horizontal) thickness 113b. As shown, the oxide thickness 113a over the sidewalls 108 is being compared to the oxide thickness 113b over the gate top surface 110. The Si oxide thickness 113b is in the range of about 1 to 20 nanometers (nm). The gate insulator stack 111/112 has an overall thickness 113c in the range of about 10 to 100 nm. Poor step-coverage results in a relatively thin layer of oxide overlying corner and abrupt transition regions. If used as a gate oxide, these "thin" regions are prone breakdown. Thus, step-coverage is an important consideration in the fabrication of V-TFTs, or any active device using an oxide-covered abrupt transition surfaces.

A first source/drain region 114 overlies the gate top surface 110. A second source/drain (S/D) region 116 overlies the substrate insulation layer 104, adjacent a first gate sidewall 108a. A channel region 118 overlies the gate insulator stack 111/112 on the first gate sidewall 108a, interposed between the first S/D region 114 and the second source/drain region 116.

Note, although the sidewalls 108 have been described as vertical with respect the horizontal surface of the substrate 102, in other aspects not shown, the sidewalls can be graded or curved. That is, the sidewalls 108 need not be perpendicular to the substrate surface. Although not specifically shown in the figure, additional layers of insulator may be used to separate gate top surface 110 from the first S/D region 114.

Figure 2:
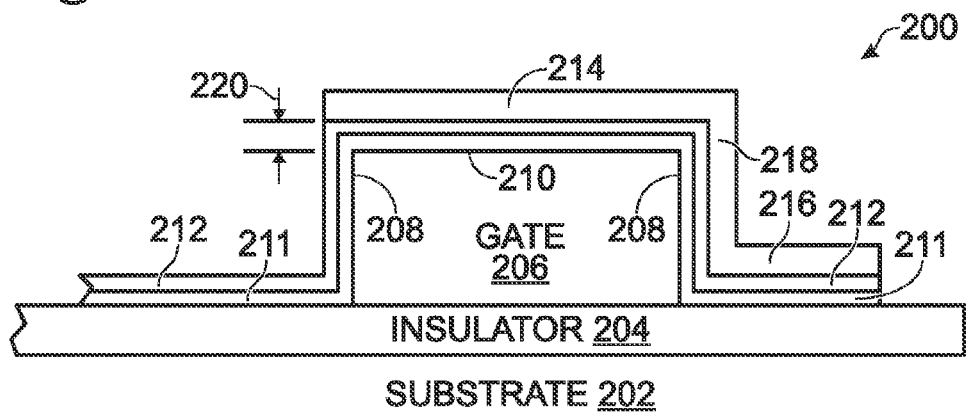
FIG. 2 is a partial cross-sectional view of a V-TFT device variation.

FIG. 2 is a partial cross-sectional view of a V-TFT device variation. The V-TFT 200 comprises a substrate 202 and a substrate insulation layer 204 overlying the substrate 202. Generally, the substrate 102 can be a material such as glass, silicon, Si<100>, Si<111>, or plastic. The substrate 102 can also be a temperature-sensitive transparent glass, quartz, or plastic material.

A gate 206, having vertical sidewalls 208 and a top surface 210, overlies the substrate insulation layer 204. A first Silicon oxide (SiOx) layer 211 overlies the gate top surface 210 and sidewalls 208, where x is less than, or equal to 2. A second SiOx layer 212 overlies the first SiOx layer 211. Together, first Si oxide layer 211 and second Si oxide layer 212 form the gate insulator stack. A first source/drain region 214 overlies the gate top surface 210. A second source/drain (S/D) region 216 overlies the substrate insulation layer 204, adjacent a first gate sidewall 208a. A channel region 218 overlies the gate insulator stack 211/212 on the first gate sidewall 208a, interposed between the first S/D region 214 and the second source/drain region 216.

The gate insulator stack 211/212 has a thickness 220 in the range of about 10 to 100 nm and an oxide charge concentration of less than $5 \times 10^{11}$ per square centimeter ($cm^{-2}$). As used herein, oxide charge concentration refers to the combination of oxide fixed charges, oxide trapped charges, and mobile (ionic) charges. Since perfect step-coverage is difficult to achieve, the thickness 220 is being defined with respect to oxide 211/212 overlying the gate top surface 210, which is potentially thicker than the Si oxide overlying the sidewalls 208.

As in FIG. 1, the sidewalls 208 have been described as vertical with respect the horizontal surface of the substrate 202, however in other aspects not shown, the sidewalls can be graded or curved. That is, the sidewalls 208 need not be perpendicular to the substrate surface. Although not specifically shown in the figure, additional layers of insulator may be used to separate gate top surface 210 from the first S/D region 214.

Figure 3:
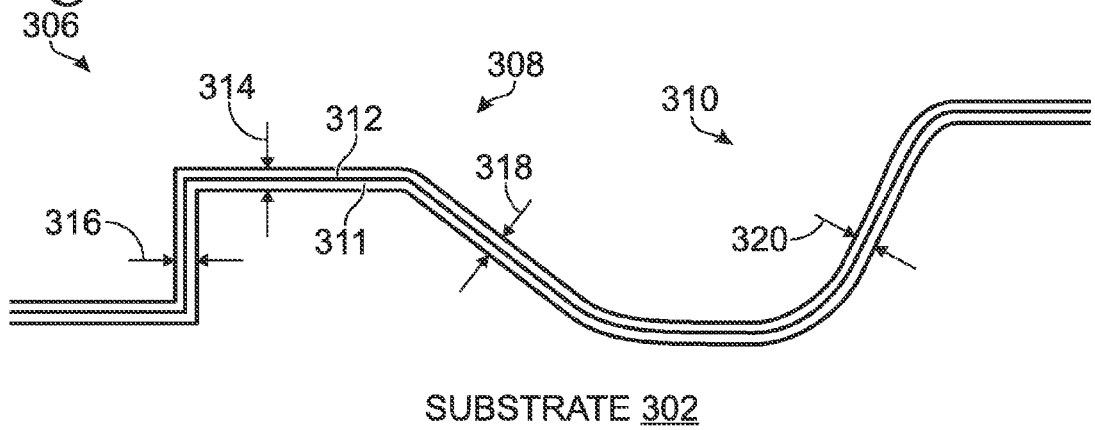
FIG. 3 is a partial cross-sectional view of a silicon oxide thin-film structure formed overlying an abrupt transition surface.

FIG. 3 is a partial cross-sectional view of a silicon oxide thin-film structure formed overlying an abrupt transition surface. The structure 300 comprises a substrate 302 having a surface 304 with an abrupt transition. The substrate 302 can be a material such as Si, Si <100>, Si <111>, silicon oxide, glass, plastic, or quartz, to name a few examples. Shown are a step 306, a grade 308, and a curved surface 310. A first Si oxide (SiOx) layer 311, where x is less than, or equal to 2, overlies surfaces 306, 308, and 310. A second SiOx layer 312 overlies the first SiOx layer 311. Together, the first Si oxide layer 311 and the second Si oxide layer 312 form a Si oxide thin-film stack. The stack 311/312 has a thickness in the range of about 10 to 100 nm, an oxide charge concentration of less than $5 \times 10^{11}$ $cm^{-2}$, and a step-coverage of greater than 65%. The step-coverage is defined as the ratio of the silicon oxide over the abrupt transition surface, as compared to a planar surface. With respect to step 306, the step-coverage is defined as the ratio 316/314. With respect to the graded surface 308, the step-coverage is the ratio 318/314. With respect to the curved surface 310, the step-coverage is the ratio 320/314.

Functional Description

The invention describes a novel high-density plasma oxidation process, employing an inductively coupled plasma source, for the post-deposition oxidation of oxide thin-films at process temperatures lower than 400° C. The high-density plasma process is effective in the efficient generation of oxygen radicals to effectively improve the oxidation state of an oxide film, enhancing its electrical performance. The present invention also addresses the issues of the step coverage, interface quality, and reliability for the advanced submicron TFT devices requiring thinner gate dielectric (500 Å, or less). A combination of a high-density plasma technique and a standard PECVD technique are used to form a high quality oxide thin film with high step-coverage, and high interface quality and reliability. The high-density plasma source based-oxide growth technique improves the interface quality by growing conformal thermal quality oxide thin film on Si, at processing temperature lower than 400° C.

The bulk of the oxide on the interfacial oxide is deposited at low temperature (<400° C.) with a TEOS precursor-based oxide deposition process. The low temperature TEOS process provides a high step coverage desired for high aspect ratio structures in advanced sub-micron devices. The electrical quality of the low temperature deposited oxide thin films is improved by using a high-density plasma-based oxidation process. The present invention describes an efficient low thermal budget high-density plasma oxidation process for TEOS oxide thin films. The high-density plasma process is effective in the generation of active oxygen radicals suitable for the low temperature growth of thermal quality $SiO_2$ thin films on Si. The active oxygen radicals effectively diffuse through $SiO_2$ lattice and improve the bulk and interfacial microstructure. Additionally, the active oxygen species effectively minimize any carbon related impurities in low temperature processed TEOS oxide films by forming CO. The high-density plasma process is suitable for low temperature oxidation with minimal plasma induced damage to the TEOS oxide films, due to low plasma potential of the high-density plasma process.

Standard TEOS oxide deposition processes are suitable for large area processing. However, the process control and the electrical quality of thin oxide films become increasingly important at thicknesses below 500 Å. TEOS oxide films deposited at high temperature show poor step coverage. The step-coverage of TEOS oxide films can be increased by decreasing the process temperature. However, the electrical performance of the TEOS oxide film degrades rapidly as the process temperature falls below 400° C. The $SiO_2$/Si interface quality is also critical for the fabrication of reliable devices at thicknesses below 500 Å. As the film thickness decreases, the interface quality dominantly controls the properties of the gate dielectric thin films.

The interface quality is improved if a high quality interfacial oxide layer can be created prior to the TEOS oxide deposition, so that the Si surface is not exposed to the high energy species impinging on the substrate during TEOS oxide deposition. In this invention, a novel high-density plasma growth technique is described for the low temperature growth of conformal, thermal quality $SiO_2$ thin films on Si surface. The high-density plasma grown $SiO_2$ film can serve as the interfacial layer and improve the interfacial characteristics due to a stoichiometric Si/O ratio and minimal plasma induced interface/bulk damage. The step coverage of the TEOS oxide films can be increased by decreasing the process temperature. The poor electrical quality of the high step-coverage TEOS oxide films can be increased by a high-density plasma oxidation process at temperatures lower than 400° C. The high-density plasma is effective in the efficient generation of active oxygen species for the low thermal budget oxidation of the TEOS oxide films. The carbon related impurities in the low temperature deposited TEOS oxide films can also be minimized by effective conversion of C to CO by active oxygen radicals.

High-Density Plasma System

Figure 4:
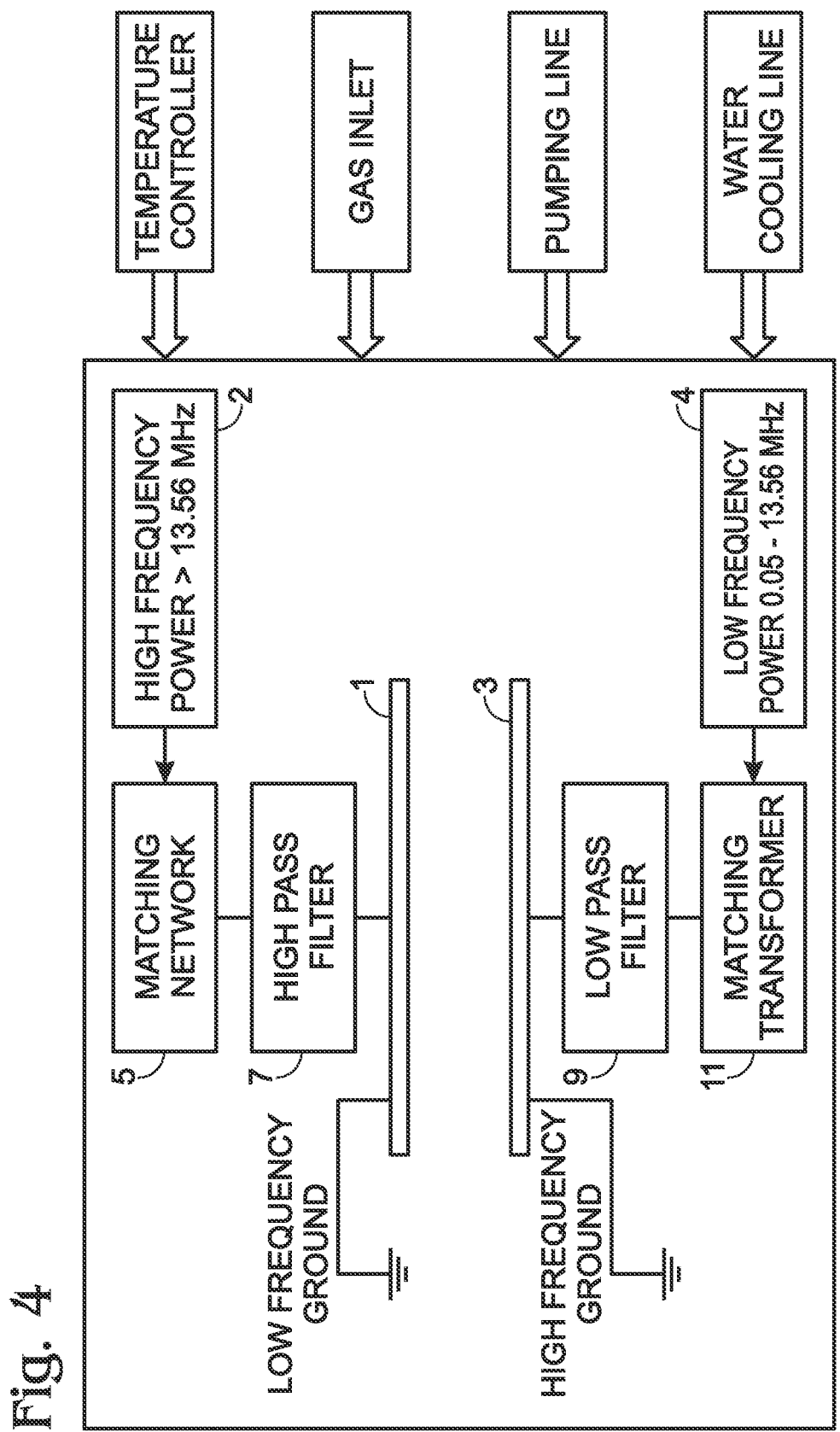
FIG. 4 is a schematic drawing of a high-density plasma (HDP) system with an inductively coupled plasma source.

FIG. 4 is a schematic drawing of a high-density plasma (HDP) system with an inductively coupled plasma source. The top electrode 1 is driven by a high-density inductively coupled plasma (ICP) source 2, which is a type of radio frequency (RF) source, while bottom electrode 3 is driven by a lower frequency power source 4. The RF power is coupled to the top electrode 1, from the high-density inductively coupled plasma source 2, through a matching network 5 and high pass filter 7. The power to the bottom electrode 3, through a low pass filter 9 and matching transformer 11, can be varied independently of the top electrode 1. The top electrode power frequency can be in the range of about 13.56 to about 300 megahertz (MHz) depending on the ICP design. The bottom electrode power frequency can be varied in the range of about 50 kilohertz (KHz) to about 13.56 MHz, to control the ion energy. The pressure can be varied up to 500 mTorr. The top electrode power can be as great as about 10 watts per square-centimeter ($W/cm^2$), while the bottom electrode power can be as great as about 3 $W/cm^2$.

Figure 5A:
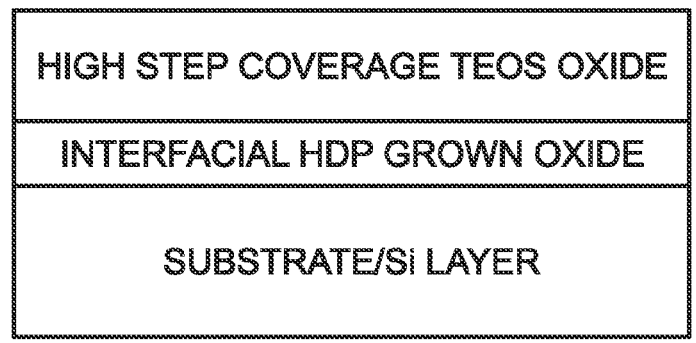
FIGS. 5A and 5B depict stacked dielectric structures for planar and high aspect ratio features, respectively.
Figure 5B:
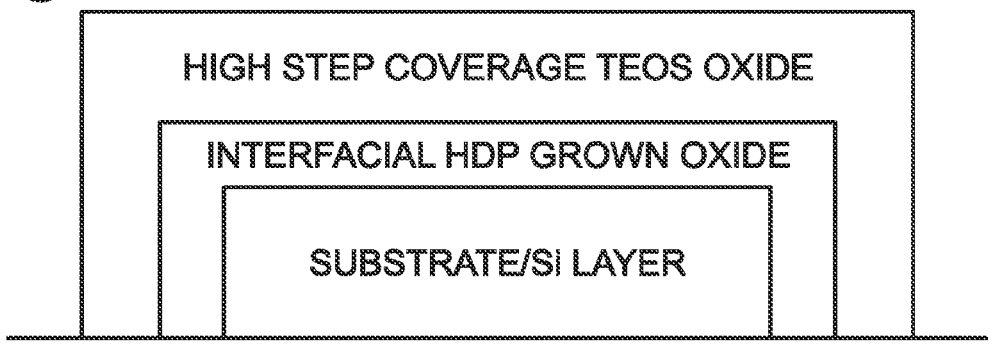

FIGS. 5A and 5B depict stacked dielectric structures for planar and high aspect ratio features, respectively. The present invention describes an approach and processing methodology to address the issues of interface quality and reliability, and step coverage with TEOS oxide thin films; especially, at thicknesses smaller than 500 Å. The various issues related to oxide quality, interface reliability, and step coverage can be addressed by fabricating the stacked dielectric structure, as shown. The issues related to interface quality and reliability can be addressed by growing a conformal, thermal quality interfacial oxide layer, as shown, by a high-density plasma growth process at temperatures below 400° C. The desired $SiO_2$ thickness can then be achieved by depositing a high step-coverage TEOS oxide layer by PECVD or any other suitable technique. The bulk and the interface quality of the low-temperature processed TEOS oxide thin films can be enhanced by high-density plasma oxidation process at temperatures lower than 400° C.

High-Density Plasma Oxidation Process

The high-density plasma oxidation process described in this invention has been successfully used for the low temperature oxidation of Si films. Further, a high-density plasma growth process, with high $SiO_2$ growth rates at temperatures lower than 400° C., can be used where conventional thermal growth is impractical. The plasma-grown $SiO_2$ thin-films (grown at 350° C.) have a high quality, comparable to thermal oxides grown at temperatures of higher than 800° C.

Figure 6:
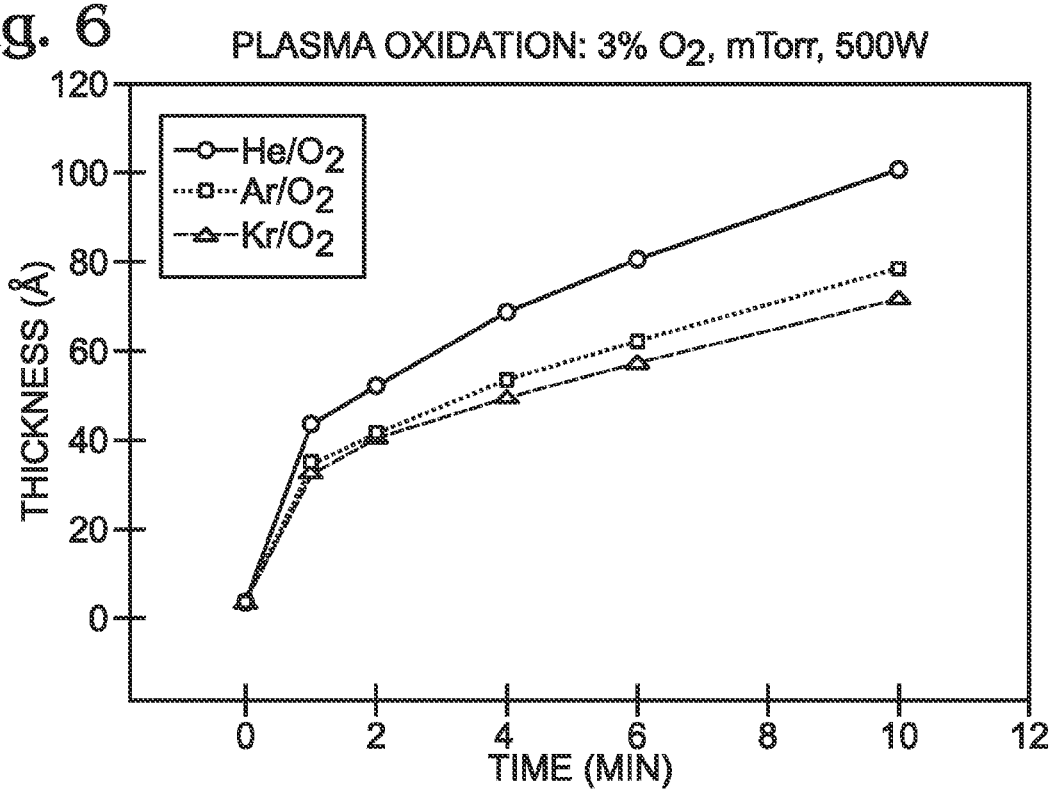
FIG. 6 is a graph depicting some exemplary high-density plasma growth rates in various inert gas/$O_2$ atmospheres.

FIG. 6 is a graph depicting some exemplary high-density plasma growth rates in various inert gas/$O_2$ atmospheres. The high-density plasma process is effective in growing $SiO_2$ thin-films at temperatures lower than 400° C., at rates significantly higher than the thermal oxide rates, which are impractical below 800° C. As shown in FIG. 6, it is possible to obtain a growth rate of 100 Å/min after a deposition time of 10 min in He/$O_2$ atmosphere. The high-density plasma growth rates can be sustained down to an investigated temperature of about 150° C. The plasma grown oxide films show similar growth rates on <100> and <111> oriented silicon, which is desired for good step-coverage on different silicon faces. The oxygen radicals generated by the present invention process are active enough to diffuse through the 500 Å thick TEOS oxide film and improve its quality from the top surface to the Si/iO2 interface. The details of the process conditions and range for the high-density plasma growth process are listed in Table I.

TABLE 1

| High-density plasma oxidation processes for the growth of oxide thin-films. | |
|---|---|
| Top Electrode Power | 13.56-300 MHz, up to 10 $W/cm^2$, |
| Bottom Electrode Power | 50 KHz-13.56 MHz, up to 3 $W/cm^2$ |
| Pressure | 1-500 mTorr |
| Oxidation Time | 0-60 min |
| Gases | $O_2$/Inert Gas, $O_2$: 0-20% |
| Temperature | 25-400° C. |

Step-coverage and Oxide Quality Improvement

Figure 7:
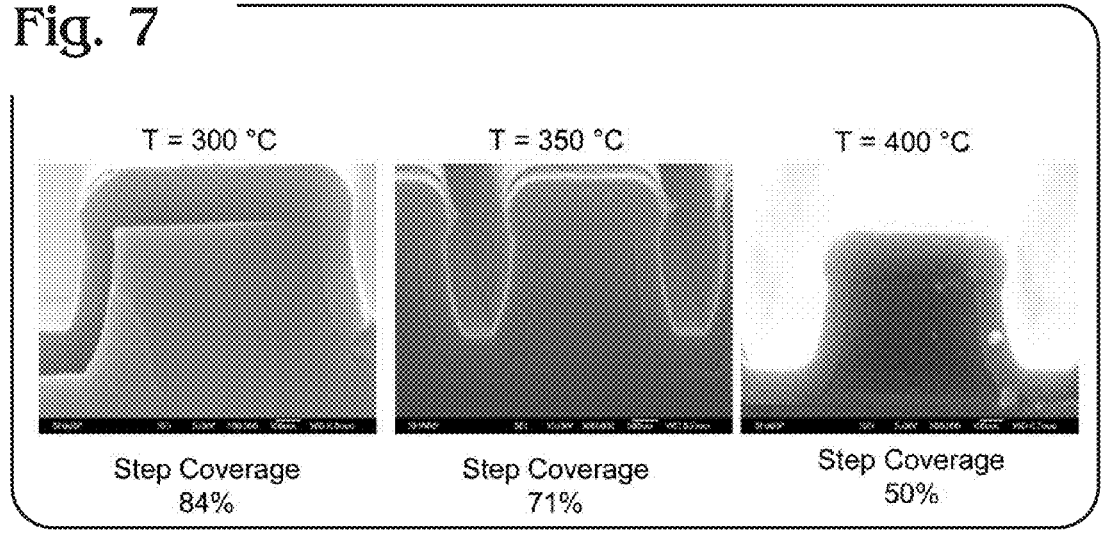
FIG. 7 depicts the step-coverage of 30 nm thick Si oxide thin-film deposited at different temperatures.

FIG. 7 depicts the step-coverage of 30 nm thick Si oxide thin-film deposited at different temperatures. TEOS oxide thin-films deposited at temperatures of 400° C., or greater, exhibit good electrical quality. However, the step-coverage is poor. The step-coverage of TEOS oxide thin-film improves as the process temperature is decreased from 400° C. As shown in FIG. 7, the step-coverage improves from 50 to 84% as the deposition temperature is decreased from 400 to 300° C. However, the electrical performance is found to degrade with decreasing temperature.

TEOS oxide thin films can be processed by any suitable PECVD or other processing techniques using TEOS precursor as a source of Si. The step coverage of the TEOS oxide can be increased by lowering the process temperature. The typical effects of the process temperature on the TEOS oxide step coverage are shown in FIG. 7. The various parameters related to TEOS oxide thin films processing are listed in Table II.

TABLE II

| TEOS oxide thin film processing conditions. | |
|---|---|
| Technique | PECVD |
| Film Thickness | 100-1000 Å |
| Process Temperature | 250-400° C. |
| Precursor and Gases: (Various combinations) | TEOS + Source of Oxygen ($O_2$, $N_2O$), etc) + Any suitable inert gas |
| Step Coverage | >50% |

The high-density plasma oxidation process described in this invention can be used for the post-deposition oxygen plasma treatment of TEOS, or any oxide, to improve its bulk and interfacial properties. The oxygen vacancies and defects are the major factors dictating the oxide quality and reliability for electronic devices. The low-temperature TEOS oxide quality is responsive to carbon (C) or other impurities, depending on the deposition temperature. The high-density plasma oxidation process offers significantly lower thermal budgets for oxidation compared to standard oxidation approaches. The process conditions and the range for the high-density plasma oxidation process are listed in table III.

TABLE III

High-density plasma oxidation process for post-deposition oxidation treatment of oxide thin films.

| | |
|---|---|
| Top Electrode Power | 13.56-300 MHz, up to 10 W/cm$^2$, |
| Bottom Electrode Power | 50 KHz-13.56 MHz, up to 3 W/cm$^2$ |
| Pressure | 1-500 mTorr |
| Oxidation Time | 0-60 min |
| Gases | O$_2$/Inert Gas, O$_2$: 0-20% |
| Temperature | 25-400° C. |

Figure 8:
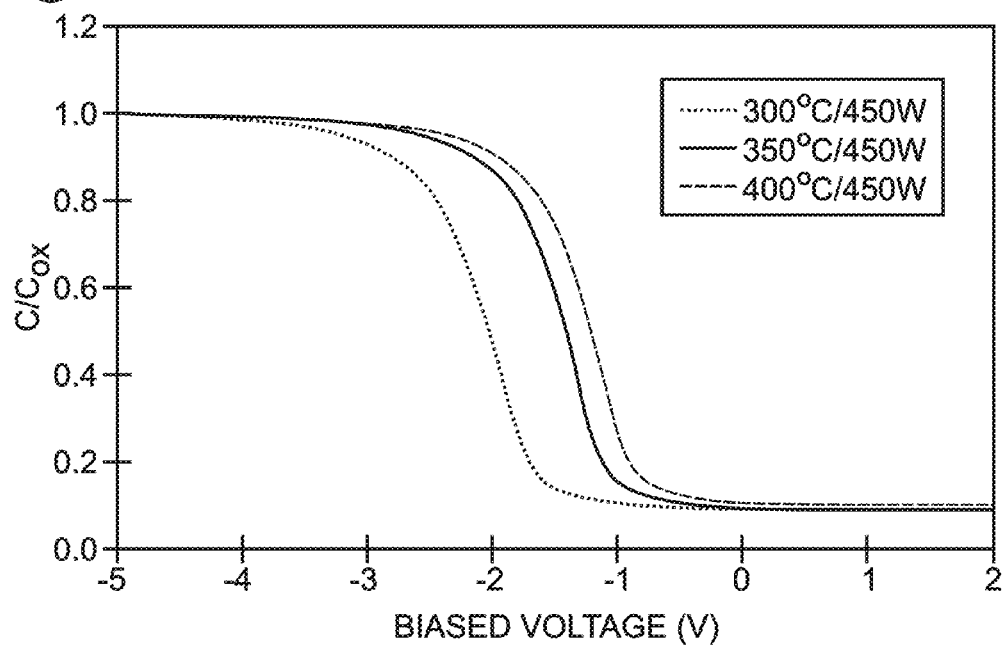
FIG. 8 is a graph depicting the effect of decreasing process temperature, with respect to the C-V response of TEOS oxide thin-films deposited by a standard PECVD process.

FIG. 8 is a graph depicting the effect of decreasing process temperature, with respect to the C-V response of TEOS oxide thin-films deposited by a standard PECVD process. As shown, the flat band voltage increases rapidly with a decrease in process temperature from 400 to 300° C. The lower electrical quality is likely due to increased impurity content and structural imperfections resulting from the use of lower temperatures.

Figure 9:
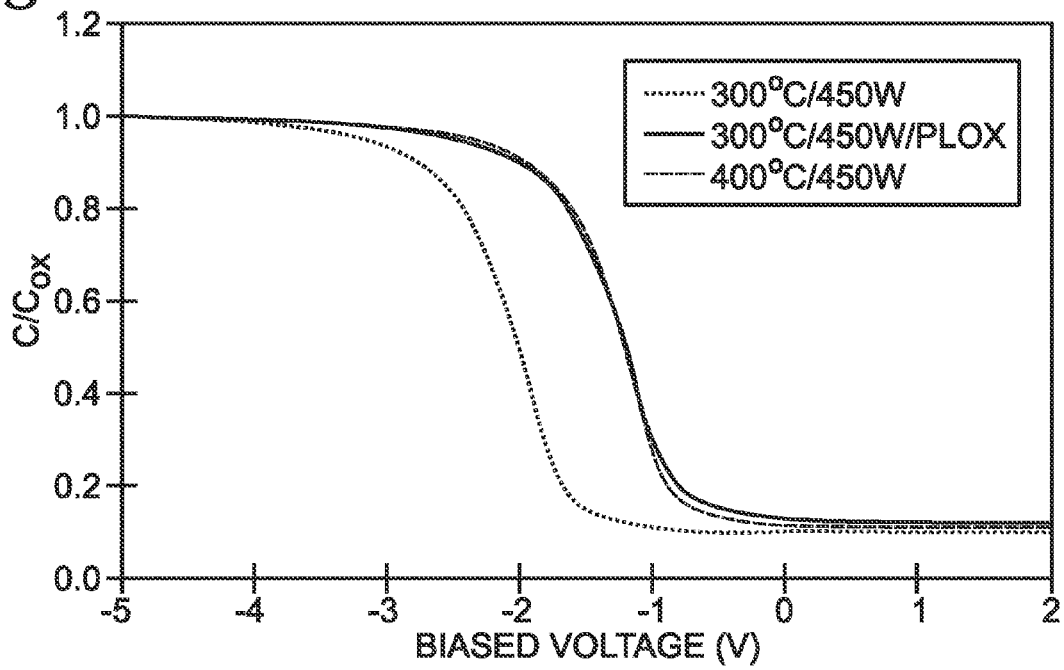
FIG. 9 is a graph depicting the effect of the post-deposition high-density oxygen plasma treatment on the C-V response of TEOS oxide film deposited at 300° C.

FIG. 9 is a graph depicting the effect of the post-deposition high-density oxygen plasma treatment on the C-V response of TEOS oxide film deposited at 300° C. The high-density plasma oxidation is carried out at 300° C. for 10 minutes. It is possible to improve the electrical quality of the TEOS oxide thin-films deposited at a temperature of 300° C. by post-deposition high-density plasma oxidation carried out at a temperature of about 300° C. for 10 minutes in He/O$_2$ atmosphere. As shown in FIG. 9, the flat band voltage of a TEOS oxide thin-film deposited at a temperature of 300° C. decreases significantly after post-deposition high-density plasma oxidation treatment at a temperature of 300° C. The C-V response of a TEOS oxide thin-film deposited at a temperature of 300° C. after plasma oxidation is comparable to a TEOS oxide film deposited at a temperature of 400° C. These results clearly demonstrate that a combination of the suitable high step-coverage oxide deposition process and post-deposition high-density plasma oxidation treatment can be effectively used for V-TFT or other device structures requiring the deposition of an oxide film with high step-coverage and high electrical performance.

The electrical parameter that is most sensitive to the deposition temperature is the flat band voltage. A higher flat band voltage reflects more fixed oxide charges in the film, and high oxide charges in the interface degrade TFT performance. A lower flat band voltage is desired to make high performance TFT devices. The high-density plasma oxidation process brings the flat band voltage to the levels obtained using a high temperature deposition process (400° C.).

The flat band voltage of a 50 nm thick SiO$_2$ film (TEOS oxide) is below −2V after a plasma oxidation treatment. The flat band voltage of SiO2 (TEOS oxide) samples at thicknesses of less than 30 nm is below −1V after high-density plasma oxidation. Generally, flat band voltage depends on the type of oxide material and the metal/oxide work function difference.

FIGS. 8 and 9 show that the flat-band voltage becomes more negative as the process temperature is decreased from 400 to 300° C. If step-coverage is improved by decreasing the temperature, the electrical quality degrades (the flat-band voltage becomes more negative). FIG. 9 shows that the high-density plasma oxidation treatment significantly improves the electrical quality of the film deposited at a temperature of 300° C. As is clear from FIG. 9, the flat-band voltage of a film deposited at 300° C. and exposed to high-density oxygen plasma is comparable to a conventional film deposited at 400° C.

Generally, any kind of oxide deposition at a temperature of 400° C., or greater, produces an oxide of acceptable quality. However, for TEOS oxide the film properties change very rapidly with temperature and the typical processing temperature is 400° C., or lower. The quality of a TEOS oxide deposited at a temperature of 350° C. is still sufficiently good for some applications, but not as a gate oxide. However, the properties of TEOS oxide degrade rapidly at temperatures below 350° C.

For TEOS oxide films, an improvement in the flat band voltage and the bias temperature stress reliability can be obtained by practicing the present invention high-density plasma oxidation process. For oxide thin-films in general, the high-density plasma oxidation process yields improvement can be detected in the dielectric constant, flat band voltage, interface trap charges, leakage current, and breakdown field strength.

Alternately considered, the high-density plasma oxidation process decreases the concentration of oxide charges in the bulk of the dielectric film and at its top and bottom interfaces. The flat band voltage is dependent upon the effect of oxide charges. The flat band voltage value depends on the configuration (type of metal, type of Si), while the fixed charge concentration value does not depend on the configuration. So the fixed oxide charge concentration is a normalized parameter while flat band voltage is not. The oxide charges are typically confined to the Si/SiO2 interface but can also be located in the oxide film and the top metal/oxide interface. The term "oxide charges" has been used rather than "fixed oxide charges" as the contribution of all oxide charges is considered.

The high-density plasma oxidation process described in this invention can be used for post-deposition oxygen plasma treatment of any oxide to improve its bulk and interfacial properties. The oxygen vacancies and defects are the major factors dictating the oxide quality and reliability for electronic devices. The high-density plasma oxidation process offers significantly lower thermal budgets for oxidation compared to standard oxidation approaches.

Generally, the present invention has been presented in the context of improving the quality of an oxide film, deposited at a low temperature, overlying a surface with an abrupt transition. However, the invention is also applicable to oxide grown on so-called planar surfaces. As the gate oxide thickness decreases below 50 nm, step-coverage becomes an issue even for the "planar" devices, as there are also steps in planar device surfaces. If deposition temperatures are reduced to improve the TEOS oxide step-coverage, then the principle of combining low temperature TEOS oxide+HDP (high-density plasma) oxidation becomes applicable to planar devices.

Figure 10A:
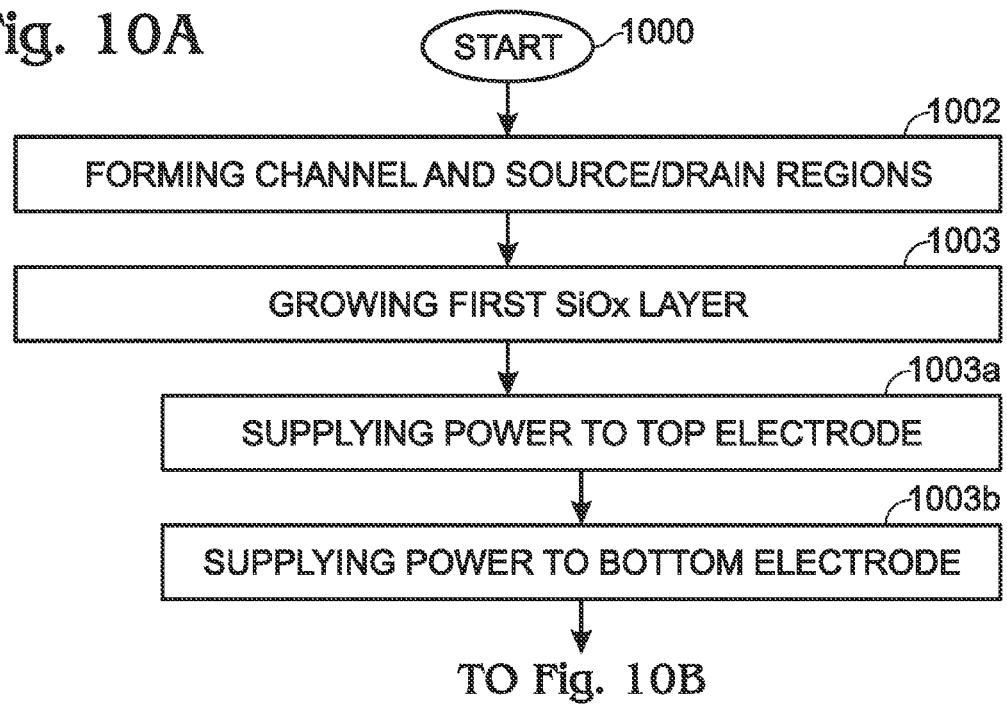
FIGS. 10A and 10B are a flowchart illustrating a method for forming a low-temperature vertical gate insulator in a V-TFT fabrication process.
Figure 10B:
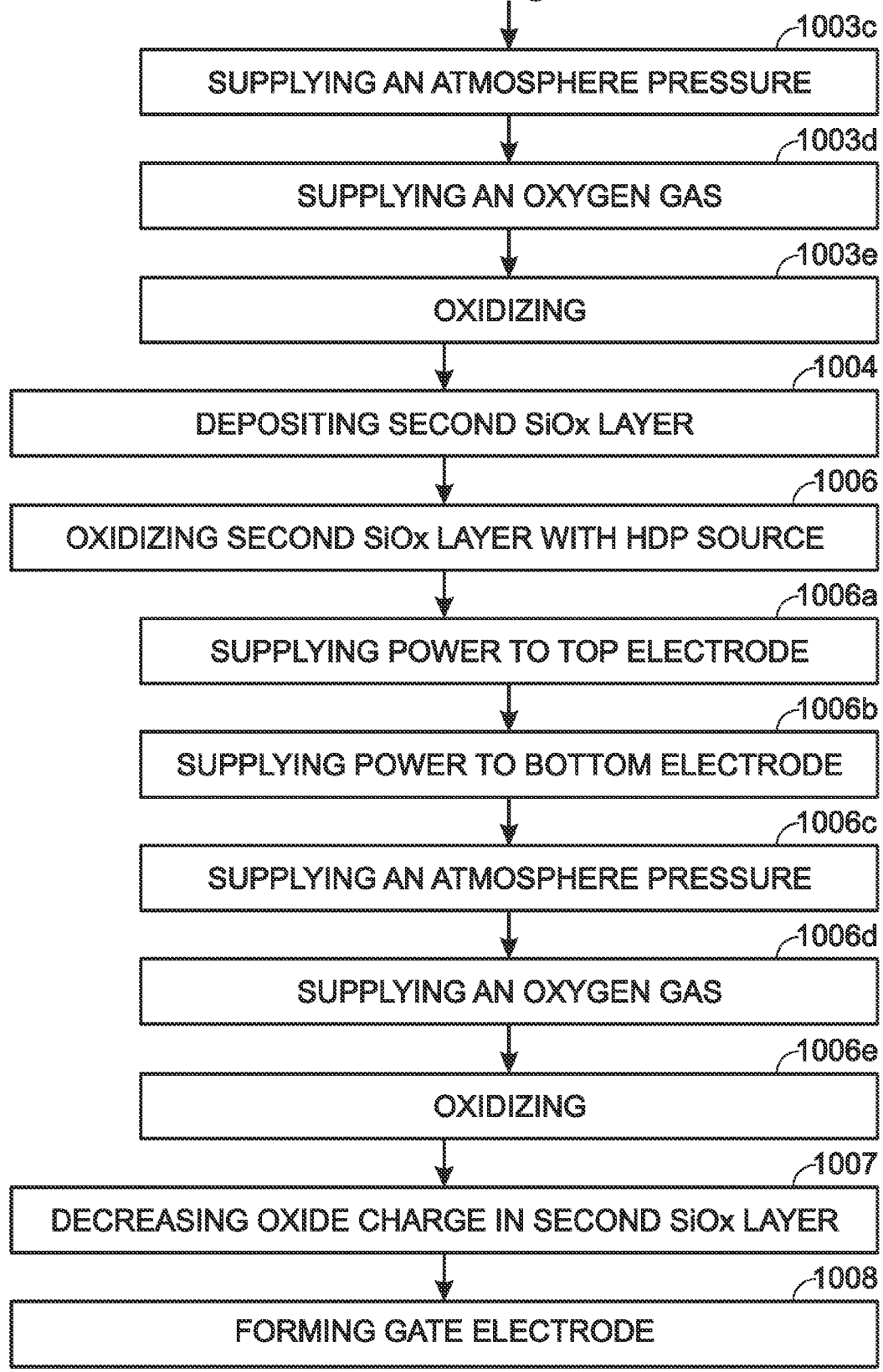

FIGS. 10A and 10B are a flowchart illustrating a method for forming a low-temperature vertical gate insulator in a V-TFT fabrication process. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1000.

Step 1002 forms a channel, first S/D region, and second S/D region in a Si active layer. Step 1003 grows a first layer of SiOx, where x is less than, or equal to 2, to a first thickness using a HDP source. In some circumstances, Step 1003 grows the first SiOx layer at a temperature of less than 400 degrees C. Step 1004 deposits a second layer of SiOx to a second thickness, greater than the first thickness, overlying the first SiOx layer. In some circumstances, Step 1004 deposits the silicon oxide at a temperature of less than 400 degrees C. Step 1006 additionally oxidizes the second Si oxide layer using the HDP source, wherein the first and second SiOx layers form a gate insulator. In some aspects, Step 1006 plasma oxidizes at a temperature of less than 400° C., using a high-density plasma source. Step 1008 forms a gate electrode adjacent the gate insulator.

In a vertical TFT aspect, growing the first SiOx layer in Step 1003, depositing the second SiOx layer in Step 1004, and oxidizing in Step 1006 all include forming the gate insulator overlying the gate electrode (Step 1008 is performed prior to Step 1002). Then, Step 1002 forms the first S/D region over a gate electrode top surface, the second S/D region over a gate insulator layer, adjacent a gate electrode first sidewall, and the channel region overlying the gate insulator on the gate first sidewall In one aspect, forming the first and second SiOx layers in Steps 1003 and 1004 includes forming a gate insulator having a step-coverage of greater than 65%, comparing the gate top surface to gate sidewalls. In one other aspect, Step 1004 uses a plasma-enhanced chemical vapor deposition (PECVD) process with tetraethylorthosilicate (TEOS) precursors to deposit the Si oxide.

In one aspect, using the HDP source to grow the first SiOx layer in Step 1003, and to additionally oxidize the second layer of SiOx in Step 1006 includes using an inductively coupled plasma (ICP) source to grow the first layer of SiOx and the additionally oxidize the deposited second layer of SiOx . Note, these steps are not performed simultaneously.

Thus, Step 1003 uses an ICP source with the following substeps (not shown), see Table 1 above. Step 1003*a* supplies power to a top electrode at a frequency in the range of 13.56 to 300 MHz, and a power density of up to 10 W/cm$^2$. Step 1003*b* supplies power to a bottom electrode at a frequency in the range of 50 kilohertz to 13.56 MHz, and a power density of up to 3 W/cm$^2$. Step 1003*c* uses an atmosphere pressure in the range of 1 to 500 mTorr. Step 1003*d* supplies an oxygen gas.

In one aspect, supplying an oxygen gas in Step 1003*d* includes: mixing O$_2$ and an insert gas in a ratio in the range of 0 to 20%; and, using an inert gas such as He, Ar, or Kr. Then, the method further comprises Step 1003*e*, which oxidizes for a duration in the range of 1 to 60 minutes. Alternately, Step 1003*d* includes supplying oxygen gas from a source such as N$_2$O, O$_2$, or O$_3$.

Likewise, plasma oxidizing the second SiOx layer in Step 1006 includes using the ICP source with the following substeps (not shown), see Table 1 above. Step 1006*a* supplies power to a top electrode at a frequency in the range of 13.56 to 300 MHz, and a power density of up to 10 W/cm$^2$. Step 1006*b* supplies power to a bottom electrode at a frequency in the range of 50 kilohertz to 13.56 MHz, and a power density of up to 3 W/cm$^2$. Step 1006*c* uses an atmosphere pressure in the range of 1 to 500 mTorr. Step 1006*d* supplies an oxygen gas.

In one aspect, supplying an oxygen gas in Step 1006*d* includes: mixing O$_2$ and an insert gas in a ratio in the range of 0 to 20%; and, using an inert gas such as He, Ar, or Kr. Then, the method further comprises Step 1006*e*, which oxidizes for a duration in the range of 1 to 60 minutes. Alternately, Step 1006*d* includes supplying oxygen gas from a source such as N$_2$O, O$_2$, or O$_3$.

In one aspect, Step 1007 decreases the concentration of oxide charge in the second SiOx layer in response to additionally oxidizing the second layer of SiOx. If growing the first layer of SiOx (Step 1003) and depositing the second layer of SiOx layer (Step 1004) includes forming an SiOx stack thickness in the range of about 10 to 100 nm. Then, Step 1007 forms an oxide charge concentration of less than $5 \times 10^{11}$ per square centimeter (cm$^{-2}$).

In another aspect, using the HDP source to grow the first layer of SiOx to a first thickness in Step 1003 includes growing the first layer of SiOx to a first thickness in the range of about 1 to 20 nanometers (nm). In a different aspect, growing the first layer of SiOx to the first thickness includes growing the first layer of SiOx at an initial growth rate of 10 nm per minute. Alternately considered, growing the first layer of SiOx to the first thickness (Step 1003) and depositing the second layer of SiOx to the second thickness (Step 1004) includes forming a SiOx stack with a combined thickness in the range of about 10 to 100 nm.

A high-density plasma oxidation method for forming a multilayer Si oxide insulator has been presented along with some oxide-covered structures that benefit from this process. Some details of specific materials and fabrication steps have been used to illustrate the invention. However, the invention is not limited to merely these examples. Other variations and embodiments of the invention will occur to those skilled in the art.

We claim:

1. In a thin-film transistor (TFT) fabrication process, a method for forming a gate insulator, the method comprising:

forming a channel, first source/drain (S/D) region, and a second S/D region in a Silicon (Si) active layer;

in an atmosphere including oxygen and inert gas, where oxygen is less than 10% of the atmosphere and the pressure is 500 mTorr or less, and using a high-density plasma (HDP) source that creates an electron concentration of greater than $1 \times 10^{10}$ cm$^{-3}$, generating oxygen radicals;

growing a first layer of Silicon oxide (SiOx) from the Si active layer, to a first thickness, where x is less than, or equal to 2;

depositing a second layer of SiOx having a second thickness, greater than the first thickness, overlying the first layer of SiOx;

using the HDP source, a less than 10% oxygen atmosphere, and a pressure of 500 mTorr or less, generating oxygen radicals;

additionally oxidizing the previously deposited second layer of SiOx, wherein the first and second SiOx layers form a gate insulator; and, forming a gate electrode adjacent the gate insulator.

2. The method of claim 1 wherein additionally oxidizing the second layer of SiOx using the HDP source includes plasma oxidizing the second layer of SiOx at a temperature of less than 400° C.

3. The method of claim 1 wherein growing the first layer of SiOx using the HDP source includes growing SiOx at a temperature of less than 400° C.

4. The method of claim 1 wherein growing the first layer of SiOx and depositing the second layer of SiOx includes forming the gate insulator overlying the gate electrode;

wherein forming the channel, first S/D region, and the second S/D region in the Si active layer includes:

forming a first source/drain region overlying a gate electrode top surface;

forming a second source/drain region overlying a substrate insulation layer, adjacent a gate first sidewall; and forming a channel region overlying the gate insulator on the gate first sidewall.

5. The method of claim 4 wherein forming the gate insulator overlying the gate electrode includes forming a gate insulator having a step-coverage of greater than 65%, where step-coverage is defined as a ratio of the gate insulator thickness overlying the gate first sidewall to the gate insulator thickness overlying the gate electrode top surface.

6. The method of claim 1 wherein depositing the second layer of SiOx overlying the first layer of SiOx includes depositing SiOx using a plasma-enhanced chemical vapor deposition (PECVD) process with tetraethylorthosilicate (TEOS) precursors.

7. The method of claim 1 wherein using a HDP source to grow the first layer of SiOx and to additionally oxidize the second layer of SiOx includes using an inductively coupled plasma (ICP) source to grow the first layer of SiOx, and to additionally oxidize the deposited second layer of SiOx.

8. The method of claim 1 wherein growing the first SiOx layer and additionally oxidizing the second layer of SiOx includes using an inductively coupled plasma (ICP) source as follows:
supplying power to a top electrode at a frequency in the range of 13.56 to 300 megahertz (MHz), and a power density of up to 10 watts per square centimeter (W/cm$^2$);
supplying power to a bottom electrode at a frequency in the range of 50 kilohertz to 13.56 MHz, and a power density of up to 3 W/cm$^2$; and,
using an atmosphere pressure in the range of 1 to 500 mTorr; and
supplying an oxygen source gas.

9. The method of claim 8 wherein supplying an oxygen gas includes mixing the oxygen source gas with an inert gas selected from the group including He, Ar, and Kr; and
wherein additionally oxidizing using the HDP source includes oxidizing for a duration in the range of 1 to 60 minutes.

10. The method of claim 8 wherein supplying the oxygen source oxygen gas includes supplying an oxygen source gas selected from the group including $N_2O$, $O_2$, and $O_3$.

11. The method of claim 1 further comprising:
in response to additionally oxidizing the second layer of SiOx, decreasing a concentration of oxide charge in the second SiOx layer.

12. The method of claim 11 wherein growing the first layer of SiOx and depositing the second layer of SiOx layer includes forming an SiOx stack thickness in the range of about 10 to 100 nm; and
wherein decreasing the concentration of oxide charge in the second SiOx layer includes forming an oxide charge concentration of less than $5 \times 10^{11}$ per square centimeter ($cm^{-2}$).

13. The method of claim 1 wherein using the HDP source to grow the first layer of SiOx to a first thickness includes growing the first layer of SiOx to a first thickness in the range of about 1 to 20 nanometers (nm).

14. The method of claim 13 wherein growing the first layer of SiOx to the first thickness and depositing the second layer of SiOx to the second thickness includes forming a SiOx stack with a combined thickness in the range of about 10 to 100 nm.

15. The method of claim 1 wherein growing the first layer of SiOx to the first thickness includes growing the first layer of SiOx at an initial growth rate of 10 nm per minute.

16. The method of claim 1 wherein generating the active oxygen radicals includes:
diffusing oxygen radicals through an SiOx lattice; and,
improving the bulk and interfacial microstructures in the lattice.

17. The method of claim 1 wherein generating the active oxygen radicals includes forming CO, to minimize carbon-related impurities in the second SiOx layer.

18. In a thin-film transistor (TFT) fabrication process, a method for forming a gate insulator, the method comprising:
forming a channel, first source/drain (S/D) region, and a second S/D region in a Silicon (Si) active layer;
in an atmosphere including oxygen and inert gas, where oxygen is less than 10% of the atmosphere and using a high-density plasma (HDP) source that creates an electron concentration of greater than $1 \times 10^{10}$ cm$^{-3}$, growing a first layer of Silicon oxide (SiOx) from the Si active layer, to a first thickness, where x is less than, or equal to 2;
depositing a second layer of SiOx having a second thickness, greater than the first thickness;
using the HDP source, additionally oxidizing the previously deposited second layer of SiOx, wherein the first and second SiOx layers form a gate insulator;
forming a gate electrode adjacent the gate insulator; and,
wherein growing the first SiOx layer and additionally oxidizing the second layer of SiOx includes using an inductively coupled plasma (ICP) source as follows:
supplying power to a top electrode at a frequency in the range of 13.56 to 300 megahertz (MHz), and a power density of up to 10 watts per square centimeter (W/cm$^2$);
supplying power to a bottom electrode at a frequency in the range of 50 kilohertz to 13.56 MHz, and a power density of up to 3 W/cm$^2$; and,
using an atmosphere pressure in the range of 1 to 500 mTorr; and
supplying an oxygen source gas.

19. In a thin-film transistor (TFT) fabrication process, a method for forming a gate insulator, the method comprising:
forming a channel, first source/drain (S/D) region, and a second S/D region in a Silicon (Si) active layer;
in an atmosphere including oxygen and inert gas, where oxygen is less than 10% of the atmosphere and using a high-density plasma (HDP) source that creates an electron concentration of greater than $1 \times 10^{10}$ cm$^{-3}$, growing a first layer of Silicon oxide (SiOx) from the Si active layer, to a first thickness, where x is less than, or equal to 2;
depositing a second layer of SiOx having a second thickness, greater than the first thickness, overlying the first layer of SiOx, using a plasma-enhanced chemical vapor deposition (PECVD) process with tetraethylorthosilicate (TEOS) precursors;
using the HDP source, additionally oxidizing the previously deposited second layer of SiOx, wherein the first and second SiOx layers form a gate insulator; and,
forming a gate electrode adjacent the gate insulator having a step-coverage of greater than 65%, where step-coverage is defined as a ratio of the gate insulator thickness overlying the gate first sidewall to the gate insulator thickness overlying the gate electrode top surface.

* * * * *